(12) United States Patent
Gaynor

(10) Patent No.: US 6,706,623 B1
(45) Date of Patent: Mar. 16, 2004

(54) METHOD AND SYSTEM FOR AVOIDING PLASMA ETCH DAMAGE

(75) Inventor: Justin F. Gaynor, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 619 days.

(21) Appl. No.: 09/346,435

(22) Filed: Jul. 1, 1999

Related U.S. Application Data

(62) Division of application No. 09/208,082, filed on Dec. 9, 1998, now abandoned.
(60) Provisional application No. 60/069,002, filed on Dec. 10, 1997.

(51) Int. Cl.$^7$ .................................. H01L 21/4763
(52) U.S. Cl. .................. 438/620; 438/637; 438/714
(58) Field of Search ...................... 438/637, 714, 438/643, 626, 620; 427/99

(56) References Cited

U.S. PATENT DOCUMENTS

| | | | | |
|---|---|---|---|---|
| 4,786,360 A | * | 11/1988 | Cote et al. | 438/673 |
| 5,187,119 A | * | 2/1993 | Cech et al. | 438/626 |
| 5,354,712 A | * | 10/1994 | Ho et al. | 438/643 |
| 5,407,698 A | * | 4/1995 | Emesh | 427/99 |
| 5,604,156 A | * | 2/1997 | Chung et al. | 438/620 |
| 5,668,053 A | * | 9/1997 | Akimoto | 438/625 |
| 5,814,563 A | * | 9/1998 | Ding et al. | 438/714 |
| 5,925,577 A | * | 7/1999 | Solis | 438/725 |
| 5,981,378 A | * | 11/1999 | Bothra | 438/637 |
| 6,013,574 A | * | 1/2000 | Hause et al. | 438/622 |
| 6,017,817 A | * | 1/2000 | Chung et al. | 438/637 |
| 6,057,224 A | * | 5/2000 | Bothra et al. | 438/619 |
| 6,156,651 A | * | 12/2000 | Havemann | 438/674 |

OTHER PUBLICATIONS

S. Wolf, "Silicon Processing for VLSI ERA, vol. 1: Process Technology", Lattice Press, 1986, pp. 542–547.*

* cited by examiner

Primary Examiner—Tom Thomas
Assistant Examiner—José R. Díaz
(74) Attorney, Agent, or Firm—Jacqueline J. Garner; Wade James Brady, III; Frederick J. Telecky, Jr.

(57) ABSTRACT

An electronic device and method of construction are disclosed that provide for a dielectric layer (12) having a low dielectric constant. A conductive sheath layer (18) is disposed adjacent to the dielectric layer (12). The conductive sheath layer (18) is operable to electrically divert etchant particles used in a plasma etch process away from the dielectric layer (12). In another embodiment of the disclosed invention, a method is provided which comprises covering an inner layer (40) with a layer of dielectric material (42). The method also comprises depositing a conductive sheath layer (48) outwardly from the layer of dielectric material (42). A photoresist layer (50) is then deposited outwardly from the conductive sheath layer (48). The photoresist layer (50) is then patterned resulting in a patterned mask composed of portions of the photoresist layer (50) disposed outwardly from the conductive sheath layer (48). Portions of the conductive sheath layer (48) not covered by the patterned mask are etched using a plasma etch process selective to the conductive sheath layer (48) relative to the photoresist layer (50). Portions of the dielectric layer (42) not covered by the patterned mask are also etched using a plasma etch process selective to the dielectric layer (42) relative to the photoresist layer (50). The photoresist layer (50) is then removed from the conductive sheath layer (48), the conductive sheath layer (48) providing mechanical and electrical shielding for the dielectric layer (42).

10 Claims, 3 Drawing Sheets

METHOD AND SYSTEM FOR AVOIDING PLASMA ETCH DAMAGE

CROSS REFERENCE TO PRIOR APPLICATIONS

This application is a division of Ser. No. 09/208,082, filed Dec. 9, 1998 now abandoned which claims priority under 35 U.S.C. 120 based upon provisional application Ser. No. 60/069,002, filed Dec. 10, 1997.

TECHNICAL FIELD OF THE INVENTION

This invention relates in general to the field of electronic devices and more particularly to a system and method for avoiding plasma etch damage.

BACKGROUND OF THE INVENTION

As device geometries of integrated electronic systems become smaller, the parasitic capacitances of metal interconnects become a more stringent limiting factor than the ability to create smaller geometry features within active devices. A conductive interconnect in an integrated device exhibits a time delay which is related to the resistance and capacitance of the interconnect. One approach to reducing this time delay is to use higher conductive connectors composed of copper instead of aluminum. A separate but non-exclusive approach is to reduce the dielectric constant of the insulative materials adjacent to the interconnects by using materials other than the traditional silicon dioxide. This class of materials is generally referred to as low-K (the preferred term in this invention) or Low-E materials and typically exhibits dielectric constants less than 4.2.

The use of low-K materials presents problems during the processing of the conductive material used to make the interconnects. The conductive material is typically patterned and etched using high energy plasma etch processes. In other process schemes, the low-K material is patterned through the application and patterning of photoresist. The low-K material is etched through the photoresist mask, and then the photoresist removed with a high energy plasma etch process. The low-K materials are susceptible to damage from a plasma etch because they are softer, less chemically stable or more porous, or any combination of these factors. The plasma damage can manifest itself in higher leakage currents, lower breakdown voltages, and changes in the dielectric constant associated with the low-K dielectric material.

SUMMARY OF THE INVENTION

Accordingly, a need has arisen for a method of processing which addresses the damage to the low-K dielectric materials during the etching of either the conductive layers or photoresist in immediate contact with the low-K material. In accordance with the teachings of the present invention, a method and device architecture are provided that substantially eliminate or reduce problems associated with prior systems and methods.

According to one embodiment of the present invention, an electronic device is provided that comprises a dielectric layer having a low dielectric constant. A conductive sheath layer is disposed adjacent to the dielectric layer. The conductive sheath layer is operable to electrically divert etchant particles used in a plasma etch process away from the dielectric layer.

In another embodiment of the disclosed invention, a method is provided which comprises covering an inner layer with a layer of dielectric material. The method also comprises depositing a conductive sheath layer outwardly from the layer of dielectric material. A photoresist layer is then deposited outwardly from the conductive sheath layer. The photoresist layer is then patterned resulting in a patterned mask composed of portions of the photoresist layer disposed outwardly from the conductive sheath layer. Portions of the conductive sheath layer not covered by the patterned mask are etched using a plasma etch process selective to the conductive sheath layer relative to the photoresist layer. Portions of the dielectric layer not covered by the patterned mask are also etched using a plasma etch process selective to the dielectric layer relative to the photoresist layer. The photoresist layer is then removed from the conductive sheath layer, the conductive sheath layer providing mechanical and electrical shielding for the dielectric layer.

The disclosed invention provides several technical advantages. For example, the invention provides a process whereby damage to underlying dielectric material is substantially eliminated during the etch of overlying conductive interconnect material. A further advantage of the disclosed invention is that of preventing damage to underlying dielectric material during a resist ash process whereby the photoresist material used to pattern the dielectric layer is removed. Additionally, the invention prevents changes in the dielectric constant of the dielectric material, reduction in the breakdown voltage of the dielectric material, and higher leakage currents across the material to form parasitic electronic devices between conductive vias, for example. Other technical advantages will be readily apparent to one skilled in the art from the following figures, descriptions, and claims.

BRIEF DESCRIPTION OF THE DRAWINGS

A more complete understanding of the present invention and the advantages thereof may be acquired by referring to the accompanying figures in which like reference numbers indicate like features and wherein.

DETAILED DESCRIPTION OF THE INVENTION

Embodiments of the present invention and its advantages are best understood by referring now in more detail to FIGS. 1A–1E, 2A–2E and 3 of the drawings, like numerals being used for like and corresponding parts of the various drawings.

Figure 1A:
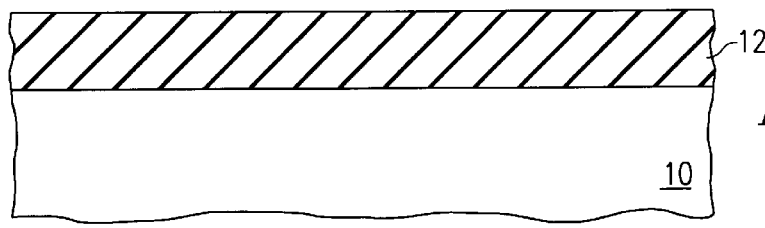
FIGS. 1A through 1E are greatly enlarged cross-sectional diagrams illustrating the method of constructing an electronic device according to the teachings of the present invention.

FIG. 1A illustrates a substrate 10. Substrate 10 may comprise single crystalline semiconductor material such as silicon or gallium arsenide. The processing steps involved in the methods of the present invention aid in the creation of conductive interconnects between various active portions of an integrated electronic device. As such, substrate 10 may also represent a layer of active devices that is formed outwardly from an underlying substrate.

Substrate 10 is covered by a layer of low-K dielectric material 12. Dielectric layer 12 may be on the order of 5,000 angstroms in thickness and may comprise a variety of dielectric materials that display a low dielectric constgant K. For example, layer 12 may comprise xerogel, aerogel, parylenes such as AF4, benzo cyclobutenes, polyarylene ethers, porous oxides such as silicon dioxide, or silsequioxanes. It should be understood that dielectric layer 12 may comprise a homogenous layer of a single material. However, dielectric layer 12 may also comprise a heterogenous stack of various materials. Layer 12 may, for example, include barrier layers, composed of a material such as diamond-like carbon, or adhesion layers to allow the dielectric layer 12 to adhere better to materials formed inwardly from layer 12, such as substrate 10.

Figure 1B:
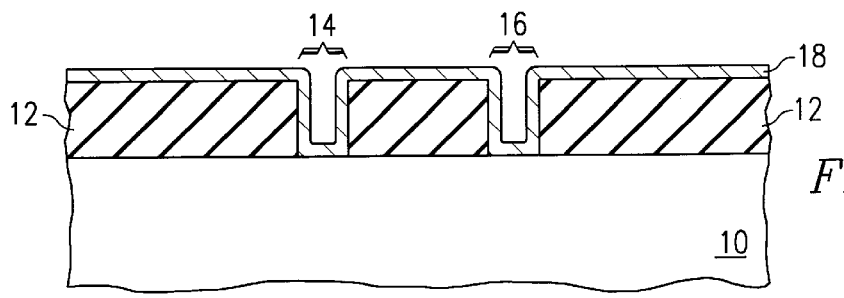

Referring to FIG. 1B, conventional photo-lithographic processes are used to pattern and etch openings in dielectric layer 12 as shown in regions 14 and 16. Ultimately, conductive vias will be formed within regions 14 and 16. The conductive vias within these regions will be surrounded by the dielectric material within dielectric layer 12. As such, the parasitic capacitances of the vias formed within regions 14 and 16 can be reduced by using the materials mentioned previously that exhibit low dielectric constants within layer 12.

Referring again to FIG. 1B, a conductive sheath layer 18 is conformally deposited outwardly from the exposed surfaces of layer 10 and layer 12. Conductive sheath layer 18 may be on the order of 250 angstroms in thickness. Conductive sheath layer 18 may comprise, for example, titanium nitride, cobalt, titanium, graphite, platinum, ruthenium, strontium, tungsten, tungsten silicide, titanium silicide, or titanium tungsten. Ultimately, the conductive vias formed in regions 14 and 16 will comprise a suitable conductor such as tungsten or aluminum. Layer 18 must comprise a material which can withstand, on a selective basis, an etchant of the material used to construct the conductive vias within regions 14 and 16. For example, if these conductive materials are constructed of aluminum, conductive sheath layer 18 must comprise a material which can withstand an etchant which is selective to aluminum relative to the material within conductive sheath layer 18. Tungsten, titanium tungsten, ruthenium and platinum are examples of species which are resistant to etch processes selective to aluminum. Similarly, titanium nitride is resistant to etch processes selective to tungsten.

Figure 1C:
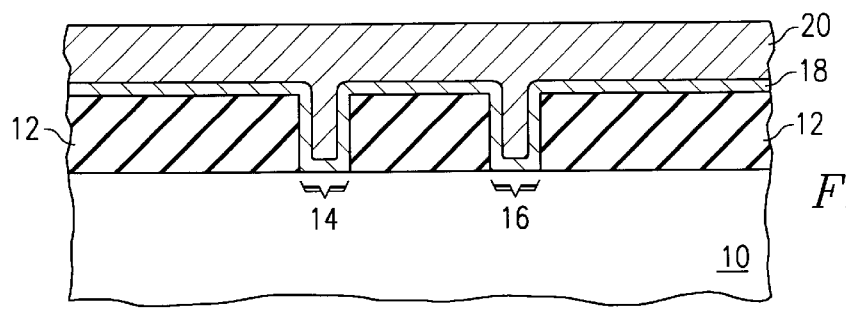

Referring to FIG. 1C, a conductive interconnect layer 20 is deposited outwardly from layer 18. Conductive interconnect layer 20 may comprise, for example, tungsten as mentioned previously. Conductive interconnect layer 20 is deposited in such a way that it fills regions 14 and 16, discussed previously.

Figure 1D:
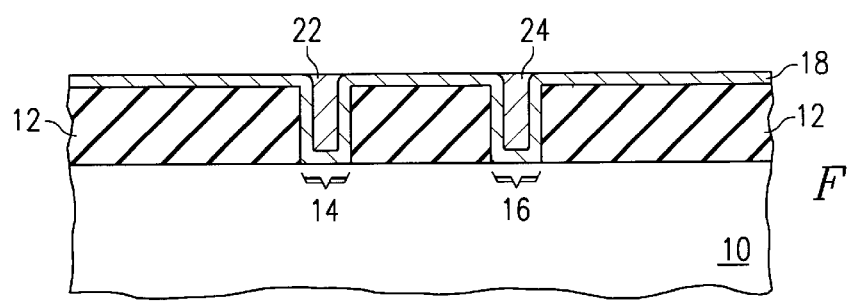
Figure 3:
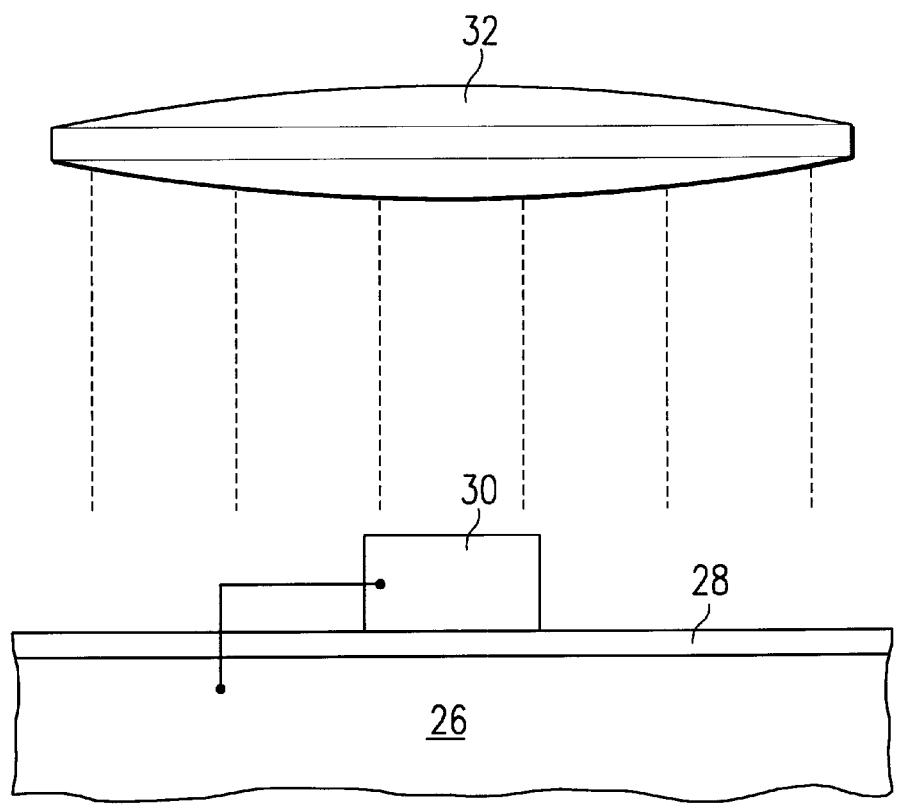
FIG. 3 illustrates the application of a high energy plasma etching process performed on a semiconductor device.

Referring to FIG. 1D, a high energy plasma etch process is used to etch conductive interconnect layer 20 until only conductive via 22 and conductive via 24 remain, within regions 14 and 16, respectively. As shown in FIG. 3, a chuck 26 may be used to hold a wafer 28 containing a semiconductor device 30 during the plasma etch process. The high energy plasma etch process may take place in an evacuated reactive chamber and may involve utilizing a source 32 to generate a glow discharge that produces chemically reactive species of etchant particles from a relatively inert gaseous mixture.

In a process utilized to etch tungsten, for example, a sulphur hexafluorine (SF6) and argon solution may comprise the relatively inert gaseous mixture. In a process utilized to etch aluminum, a chlorine, nitrogen, and $BCl_3$ solution may comprise the relatively inert gaseous mixture. Other gaseous mixtures may be utilized during plasma etching which will react chemically with the material to be etched. In a process for the plasma etching of tungsten, the etchant particles created from the glow discharge may include $SF_5+$ and F−, for example. In a process for the plasma etching of aluminum, the etchant particles created from such a discharge may include $BCl_2+$ and Cl−. Variations of chemical flow rates, temperatures, and chamber pressures used during such plasma processes are generally known in the art and are contemplated by the present invention.

Referring again to FIG. 1D and FIG. 3, during the plasma etch process highly charged etchant particles will bombard the outer surface of conductive sheath layer 18 after conductive interconnect layer 20 is etched away. Because conductive sheath layer 18 is present, a large number of particles will not be allowed to impact the dielectric layer 12. Conductive sheath layer 18 is electrically connected, at some part of the integrated device, to the same potential as substrate and chuck 26. Chuck 26 is typically used as a terminal, to carry the potential that terminates the electric field lines within the plasma chamber. As such, conductive sheath layer 18 provides a conduction path for the highly charged etchant particles. In this manner, these particles are prevented from penetrating the dielectric layer 12. If the particles were allowed to penetrate dielectric layer 12, damage may result, including changes in the dielectric constant of the material, reduction of the breakdown voltage of the material, and higher leakage currents across the material. The etch process used to form conductive interconnect vias 22 and 24 is highly selective to aluminum or other conductive material used to form conductive interconnect layer 20 relative to the material used to form conductive sheath layer 18. As such, the portions of conductive sheath layer 18 disposed outwardly from dielectric layer 12 will remain following this etch process.

Figure 1E:
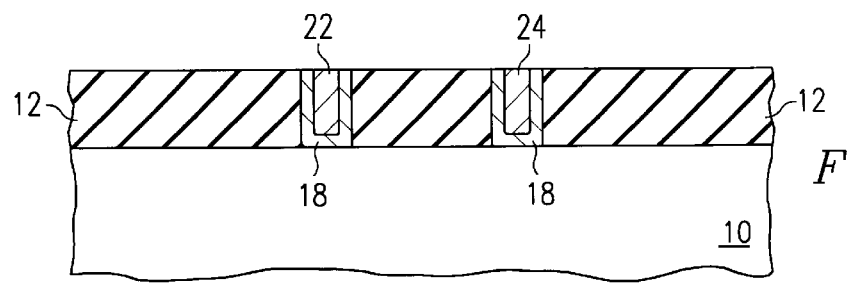

In FIG. 1E, a second etch process is used to remove the portions of conductive sheath layer 18 disposed outwardly from dielectric layer 12. This etch process results in a planar surface with conductive vias 22 and 24 ready to be interconnected with conductive interconnects or active devices to be formed outwardly from the outer surface of dielectric layer 12. It should be understood that this second etch process may be carried out in the same evacuative chamber as the etch of conductive interconnect layer 20, with a suitable change in gas chemistry to allow etching of the conductive sheath layer 18.

A second embodiment of the disclosed invention is illustrated by the accompanying FIGS. 2A through 2E. These figures describe the disclosed invention used during the etching (commonly referred to as "ashing") of a patterned photoresist disposed above a low-K dielectric layer. A plasma process is particularly damaging during the etching of photoresist because, like the exposed low-K materials patterned by the resist, the photoresist is itself a dielectric. Finding the particular etchant particles for use in a plasma process which are selective to the photoresist as compared to the underlying dielectric layer becomes very difficult.

Figure 2A:
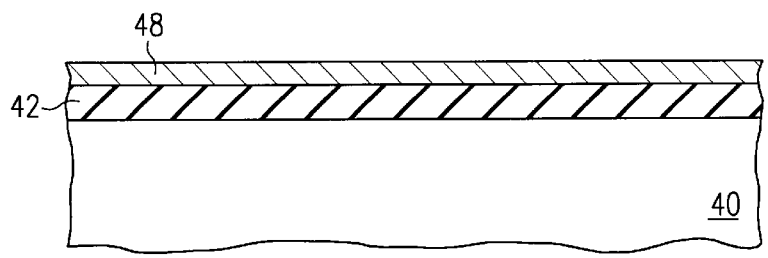
FIGS. 2A through 2E are greatly enlarged cross-sectional diagrams illustrating another embodiment of the present invention describing a method of constructing an electronic device.

FIG. 2A illustrates an underlying layer 40, such as a substrate, covered by a layer of low-K dielectric material 42. The methods of the present invention aid in the creation of conductive interconnects between various active portions of an integrated electronic device. As such, underlying layer 40 may also represent a layer of active devices that is formed outwardly from an underlying substrate. Dielectric layer 42 may be on the order of 5,000 angstroms in thickness.

Dielectric layer 42 may comprise a variety of electric materials that display a low dielectric constant K. For example, dielectric layer 42 may comprise xerogel, aerogel, parylenes such as AF4, benzo cyclobutenes, polyarylene ethers, porous oxides such as silicon dioxide, or silsequioxanes. It should be understood that dielectric layer 42 may comprise a homogeneous layer of a single material. However, dielectric layer 42 may also comprise a heterogeneous stack of various materials. Dielectric layer 42 may, for example, include barrier layers, such as diamond-like carbon, or adhesion layers, such as titanium nitride, to allow the dielectric layer 42 to adhere better to materials formed inwardly from dielectric layer 42, such as substrate 40.

Referring again to FIG. 2A, a conductive sheath layer 48 is deposited outwardly from the exposed surfaces of layer 40 and layer 42. Conductive sheath layer 48 may be on the order of 250 angstroms in thickness. Conductive sheath layer 48 may comprise, for example, titanium nitride, cobalt, titanium, graphite, platinum, ruthenium, strontium, tungsten, tungsten silicide, titanium silicide, or titanium tungsten.

Figure 2B:
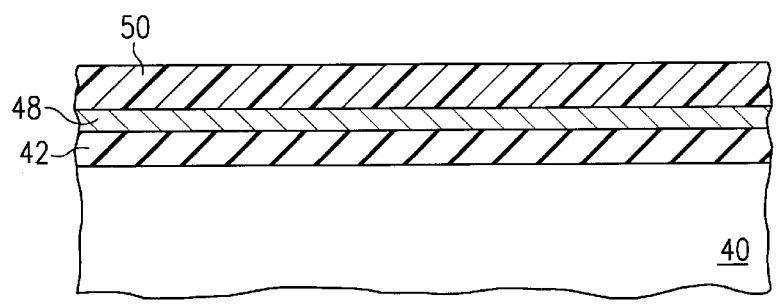
Figure 2C:
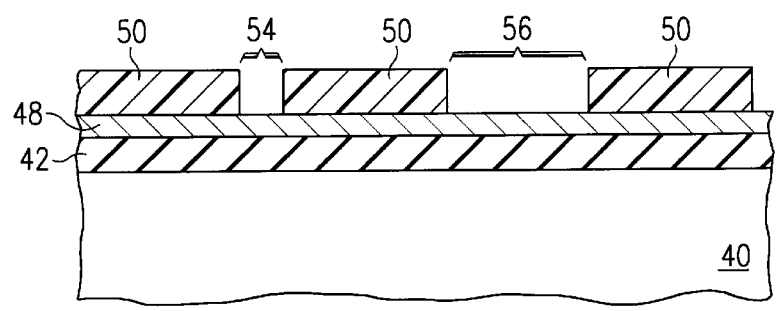

Referring to FIG. 2B, a photoresist layer 50 is deposited outwardly from conductive sheath layer 48. Photoresist layer 50 is then subjected to the standard patterned exposure and clean, resulting in a patterned mask of photoresist directly above conductive sheath layer 48, as shown in FIG. 2C. The shape of this photoresist layer 50 will determine the pattern which will be etched into dielectric layer 42.

Figure 2D:
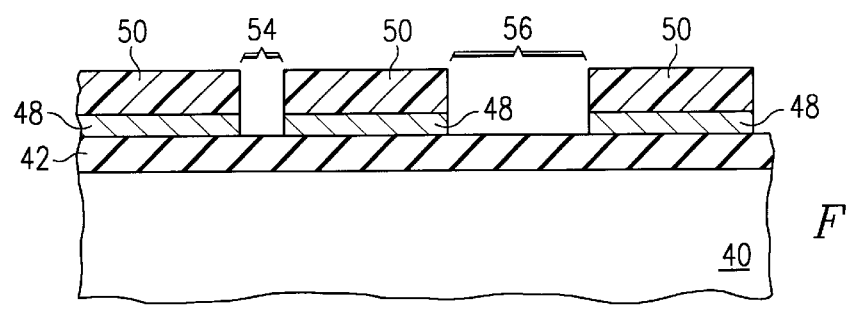

Referring to FIG. 2D, a high energy plasma etch process is used to etch the conductive sheath layer 48 as described in the previous embodiment (and shown in FIG. 3) from a relatively gaseous mixture. In the plasma etch process, there is generally a high selectivity of etching conductive sheath layer 48 relative to photoresist layer 50 for conventional metal etch chemistries. The plasma etch of conductive sheath layer 48 uses techniques described previously. Only those areas of conductive sheath layer 48 not covered by photoresist layer 50 will be etched during this step, thereby beginning the formation of regions 54 and 56.

Figure 2E:
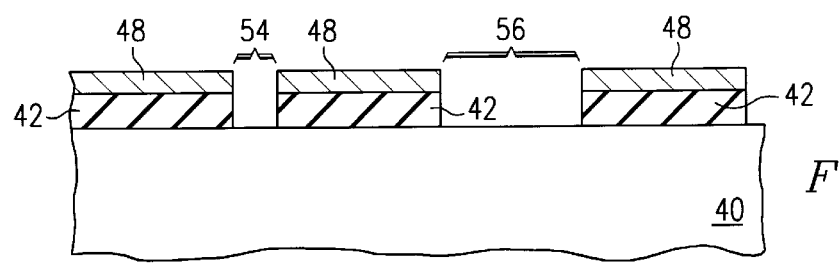

Referring to FIG. 2E, a high energy plasma etch process is used to etch dielectric layer 42 completing the formation of regions 54 and 56. The chemistry for this etch will differ from the chemistry of the etchant used to etch conductive sheath layer 48, as dielectric materials are etched most efficiently by different etchants than those etchants used to etch conductive materials. During this etch step, there will unavoidably be plasma-induced damage to the unetched portions of dielectric layer 42. However, this damage is partially mitigated by the presence of a conductive path for electrically charged etchant species along conductive sheath layer 48. Conductive sheath layer 48, as described in the first embodiment, is electrically connected to the same potential as a chuck holding the wafer during plasma (as shown in FIG. 3). An additional benefit of the invention is that if the etch selectivity between low-K dielectric layer 42 and photoresist layer 50 is poor, the already-patterned electrical sheath layer 48 will serve as an etch mask and maintain the integrity of the pattern. This reduces the demand for etch selectivity between photoresist layer 50 and dielectric layer 42.

In FIG. 2E, the photoresist layer 50 is removed from conductive sheath 48 in a third plasma etch process, generally known as resist ash. The atmosphere for this plasma etch process is generally an evacuated chamber into which oxygen or ozone is introduced and excited into a plasma. Traditionally, this step has proven detrimental to dielectric layers with a low dielectric constant, as it allows the implantation of electrically charged and/or chemically reactive species into the dielectric layer, thus greatly increasing the ability of electrical current to travel from one conductive trench or via to adjacent trenches or vias. However, the present invention, i.e., the placement of a conductive sheath layer 48 between photoresist layer 50 and underlying low-K dielectric layer 42, provides mechanical shielding for dielectric layer 42 against implantation of charged and/or chemically reactive species from the plasma, and also provides a conductive path to chuck 26 (see FIG. 3) for electrically charged particles to migrate away from dielectric layer 42. Thus, conductive sheath layer 48 prevents damage to dielectric layer 42. Regions 54 and 56 can thereafter be filled with conductive material as shown in FIGS. 1C and 1D and described above.

Conductive sheath layer 48 must comprise a material which can withstand on a selective basis an etch of the material used to construct the conductive vias or lines within regions 54 and 56. For example, if regions 54 and 56 contain conductive material constructed of tungsten, conductive sheath layer 48 must comprise a material which can withstand an etch which is selective to tungsten relative to the material within conductive sheath layer 48. Titanium nitride is an example of a species which is resistant to etchant processes selective to tungsten. Similarly, tungsten, titanium tungsten, ruthenium and platinum are resistant to etchant processes selective to aluminum.

Although the device of the present invention has been described with reference to the formation of conductive vias, it should be understood that the use of a conductive sheath layer is equally applicable to the formation of horizontal layers or structures. For example, the formation of an interconnect traversing the outer surface of a dielectric layer would also involve the plasma based etching of the conductive material used to form that interconnect. During this process, the dielectric layer would similarly be exposed to highly charged particles during the etch process. As such, a conductive sheath layer placed between the outer surface of the dielectric layer and the layer used to form such a traversing interconnect would similarly guard the dielectric layer against unwanted implantation of highly charged particles within the body of the dielectric layer.

Although the present invention has been described in detail it should be understood that various changes, alterations, substitutions, and modifications to the descriptions contained herein may be made without departing from the scope and spirit of the present invention which is solely defined by the appended claims.

What is claimed is:

1. A method of forming an electronic device comprising the steps of:
   forming a patterned dielectric layer comprising a material having a low dielectric constant less than 4.2;
   forming an electrical conduction sheath layer disposed adjacent to and over the patterned dielectric layer for electrically diverting etchant particles used in a plasma etch process away from the dielectric layer;
   forming an electrically conductive interconnect layer by a plasma etch process, said electrically conductive interconnect layer disposed adjacent to the electrically conductive sheath layer, said electrically conductive sheath being resistant to the plasma etch process used to pattern the conductive interconnect layer, and
   patterning said electrically conductive interconnect layer by said plasma etch.

2. The method of claim 1, wherein said plasma etch process includes etchant particles, further comprising the step of routing etchant particles of the plasma etch process from the dielectric layer.

3. The method of claim 1, wherein the step of forming a conductive interconnect layer further comprises the step of forming a conductive via operable to connect a substrate region disposed inwardly from the dielectric layer to active devices disposed outwardly from the dielectric layer.

4. The method of claim 2, wherein the step of routing etchant particles further comprises the step of providing a conductive path from the conductive sheath layer to a terminal for electrically charged particles to migrate away from the dielectric layer.

5. A method of constructing an electronic device comprising the steps of:

covering an inner layer with a layer of dielectric material;

depositing an electrically conductive sheath layer outwardly from the dielectric material for electrically diverting etchant particles used in a plasma etch process away from the dielectric layer;

depositing a photoresist layer outwardly from the said electrically conductive sheath layer;

patterning the photoresist layer to provide a patterned mask composed of portions of the photoresist layer disposed outwardly from the said electrically conductive layer;

etching portions of the conductive sheath layer not covered by the patterned mask with an etch selective to the electrically conductive sheath layer relative to the photoresist layer;

etching portions of the dielectric layer not covered by the patterned mask with an etch selective to the dielectric layer relative to the photoresist layer; and removing the photoresist layer from the electrically conductive sheath layer during a plasma process, the electrically conductive sheath layer providing mechanical and electrical shielding for the dielectric layer.

6. The method of claim 5, wherein the step of forming an inner layer further comprises the inner layer being fixed proximate a terminal, the terminal providing an electrical bias to the formation of the plasma.

7. The method of claim 5, wherein the step of removing the photoresist further comprises routing electrically charged particles generated during the plasma process via the conductive sheath layer away from the dielectric layer to the terminal by electrically connecting the conductive sheath layer to the terminal.

8. The method of claim 5, wherein the step of removing the photoresist layer further comprises the conductive sheath layer preventing the implantation of charged and chemically reactive species into the dielectric layer during plasma processing.

9. The method of claim 5, wherein the step of etching portions of the dielectric layer further comprises the etched portions forming contact openings.

10. The method of claim 9, further comprising filling said contact openings with conductive material.

\* \* \* \* \*